United States Patent
Chen et al.

(10) Patent No.: US 6,291,111 B1
(45) Date of Patent: Sep. 18, 2001

(54) METHOD OF TRENCH POLISHING

(75) Inventors: Coming Chen, Taoyuan Hsien; Juan-Yuan Wu, Hsinchu; Jenn Tsao; Water Lur, both of Taipei, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/165,148

(22) Filed: Oct. 1, 1998

(30) Foreign Application Priority Data

Aug. 11, 1998 (TW) .................................................. 87113159

(51) Int. Cl.⁷ ........................................................... G03F 7/00
(52) U.S. Cl. ............................ 430/5; 430/296; 430/314; 430/317; 430/322; 438/437
(58) Field of Search ............................... 430/5, 296, 322, 430/314, 317; 438/437

(56) References Cited

U.S. PATENT DOCUMENTS

| | | | |
|---|---|---|---|
| 5,208,124 | * 5/1993 | Sporon-Fiedler | .......................... 430/5 |
| 5,902,752 | * 5/1999 | Sun | ...................................... 437/195 |
| 5,926,723 | * 7/1999 | Wang | ................................... 438/437 |
| 5,926,733 | * 7/1999 | Heo | ..................................... 438/622 |
| 5,998,280 | * 12/1999 | Bergemont | ........................... 438/425 |

* cited by examiner

*Primary Examiner*—Mark F. Huff
*Assistant Examiner*—Nicole Barreca
(74) *Attorney, Agent, or Firm*—Thomas, Kayden, Horstemeyer & Risley, LLP

(57) ABSTRACT

A method of trench polishing. A semiconductor substrate is provided. A photo-mask with a pattern is provided. The method of fabricating the photo-mask further comprising providing an original pattern which comprises a plurality of active regions with individual size. The original pattern is enlarged outwards to connect and merge some of the active regions. The active regions is diminished inwards until some small active regions eliminate, the diminished line width being denoted as B. A reverse treatment is performed to obtain a reverse pattern. The reverse pattern is enlarged with a line width C. The reverse pattern is combined with the original pattern. The substrate is patterned with the photo-mask with the combined pattern. An insulation layer is formed on the substrate. The insulation layer is polished.

3 Claims, 4 Drawing Sheets

METHOD OF TRENCH POLISHING

CROSS-REFERENCE TO RELATED APPLICATION

This application claims the priority benefit of Taiwan application serial no. 87113159, filed Aug. 11, 1998.

BACKGROUND OF THE INVENTION

1. Field of the Invention

The invention relates in general to a method of trench polishing, and more particularly, to a method of fabricating a shallow trench isolation (STI) by using a reverse active mask.

2. Description of the Related Art

The fabrication line width of semiconductor fabrication process is developed towards a wavelength shorter than 1 µm as the design of integrated circuit becomes more and more complex. The very short line width limits the development of forming trench isolation in complementary metal-oxide semiconductor (CMOS). In the conventional technique of a planarization process by chemical mechanical polishing (CMP), if the underlying layer having a pattern with a pitch larger than 10 µm, a dish-like recess is formed in the active region after planarization. The requirement of a global planarization thus can not be achieved. This is the so-called "dishing effect". FIG. 1A to FIG. 1D are cross sectional views showing a method of fabricating a shallow trench isolation by chemical mechanical polishing.

In FIG. 1A, a pad oxide layer 11 is formed on a substrate 10. A dielectric layer 12 is formed on the pad oxide layer 11. Using photolithography and etching process, the dielectric layer 12 is patterned to define a device region 13 covered by the patterned dielectric layer 12. The substrate 10 is then etched to form trenches as shown in the figure. In FIG. 1B, a silicon oxide layer 14 is formed over the substrate 10 to fill the trenches by chemical vapor deposition (CVD). By chemical mechanical polishing, the silicon oxide layer 14 is planarized with the dielectric layer 12 as a polishing stop, so that oxide plugs 15 and 16 are formed as shown in FIG. 1C. The dielectric layer on the active region 13 is then removed to form the shallow trench isolation structure.

It is known that the area of each isolation structure is not identical. As shown in FIG. 1C, the area of the shallow trench isolation 16 is much bigger than the area of the shallow trench isolation 15. The shallow trench isolation 16 with a larger area has a recessed surface after being polished. In FIG. 1D, while planarizing a polysilicon layer 18 formed on the substrate 10 subsequently, a global planarization thus cannot be achieved.

In the conventional method of fabricating a shallow trench isolation, a reverse diffusion layer mask and an etch back process for an oxide layer are used to achieve the uniformity of chemical mechanical polishing. However, as the line width is reached 0.25 µm or even lower, the design rule is so tight that it is easy to cause misalignment during exposure. The problem of overlapping pattern occurs.

SUMMARY OF THE INVENTION

It is an object of the invention to provide a chemical mechanical polishing process of fabricating a shallow trench isolation. A reverse active mask is used to solve the problem of overlapping patterns caused by misalignment or error during exposure.

To achieve the above-mentioned objects and advantages, a method of trench polishing. A semiconductor substrate is provided. A photo-mask with a pattern is provided. The method of fabricating the photo-mask further comprising providing an original pattern which comprises a plurality of active regions with individual size. The original pattern is enlarged outwards to connect and merge some of the active regions. The active regions is diminished inwards until some small active regions eliminate, the diminished line width being denoted as B. A reverse treatment is performed to obtain a reverse pattern. The reverse pattern is enlarged with a line width C. The reverse pattern is combined with the original pattern. The substrate is patterned with the photo-mask with the combined pattern. An insulation layer is formed on the substrate. The insulation layer is polished.

Both the foregoing general description and the following detailed description are exemplary and explanatory only and are not restrictive of the invention, as claimed.

DESCRIPTION OF THE PREFERRED EMBODIMENTS

In the invention a novel reverse active mask is formed to improve the problem of misalignment due to reduced line width in the conventional process. In accordance with the invention, the method of trench polishing, comprises providing a semiconductor substrate, providing a photo-mask, patterning the substrate with the photo-mask with the combined pattern for defining a plurality trench regions on the substrate, forming an insulation layer on the substrate, and polishing the insulation layer. The step of providing a photo-mask further comprising providing an original pattern which comprises a plurality of active regions with individual size, enlarging the original pattern outwards to connect and merge some of the active regions, diminishing the active regions inwards until some small active regions eliminate, the diminished line width being donated as B, performing a reverse treatment to obtain a reverse pattern, enlarging the reverse pattern with a line width C, and combining the enlarged reverse pattern and the original pattern.

Figure 1A:
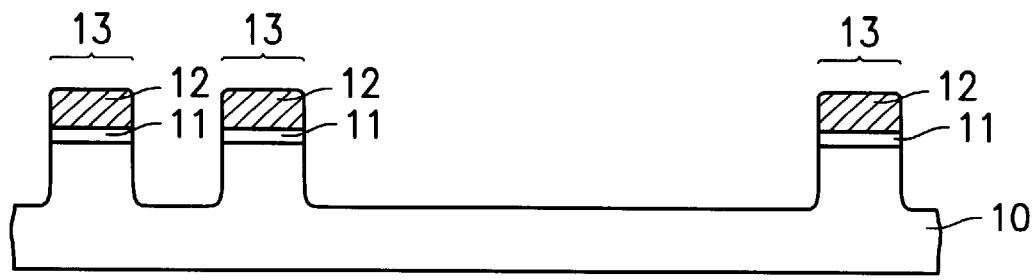
FIG. 1A to FIG. 1D are cross sectional views showing a method of forming a shallow trench isolation by a conventional chemical mechanical polishing process; and FIG. 2A to FIG. 2E shows a method of forming a reverse active mask in a preferred embodiment according to the invention.
Figure 1B:
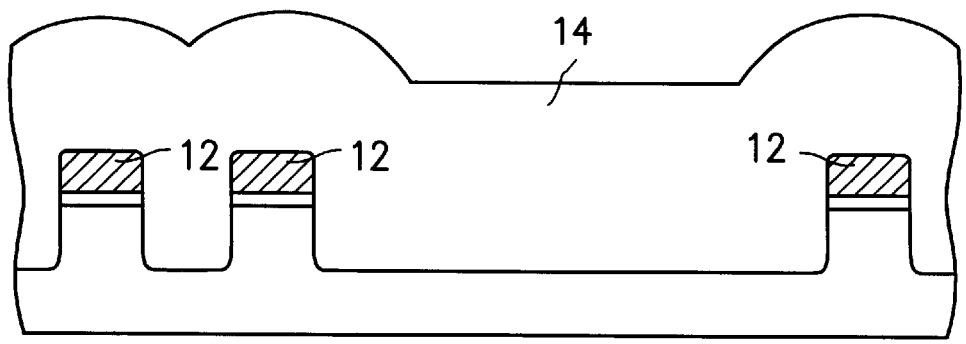
Figure 1C:
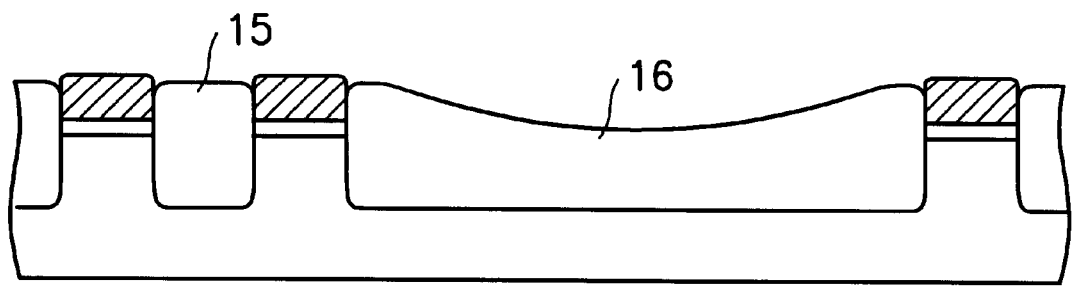
Figure 1D:
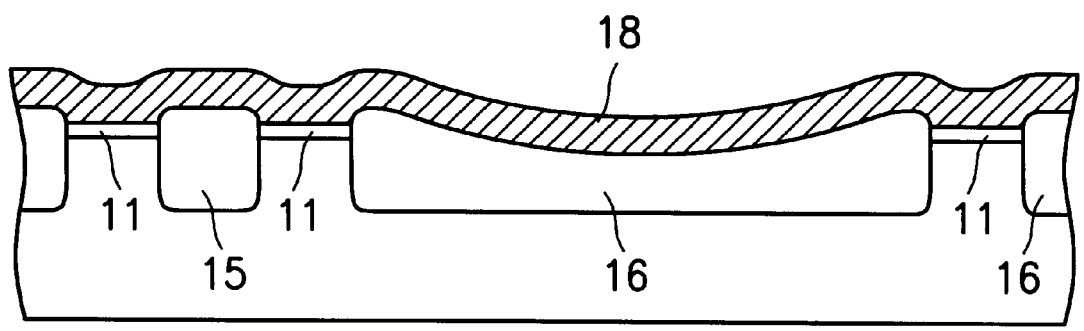
Figure 2A:
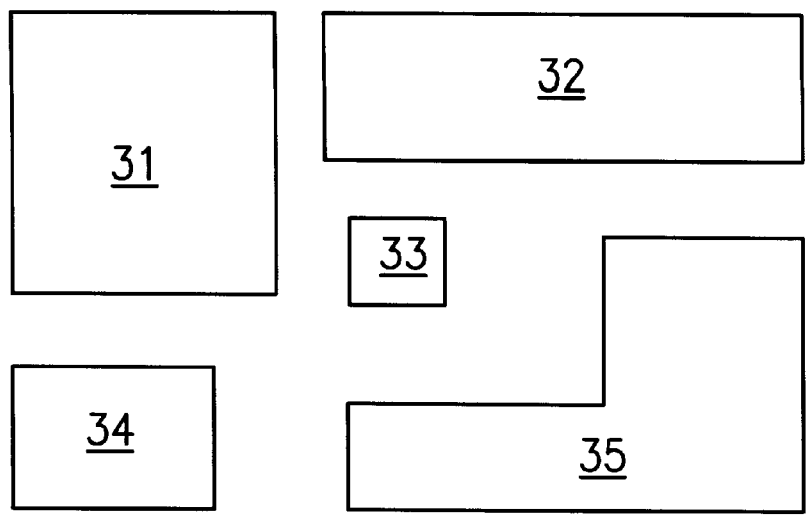

In FIG. 2A, a mask with an original pattern of active regions is shown. The pattern of the active regions is defined as practical requirements. In this example, the pattern comprises the pattern of active regions 31, 32, 33, 34, and 35. The areas of these active regions, again, are defined according to the practical requirements.

Figure 2B:
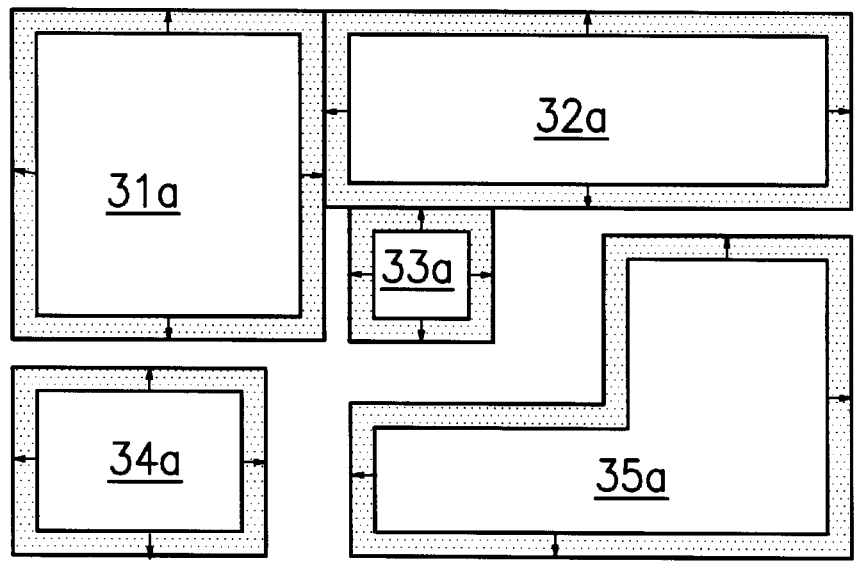

In FIG. 2B, the active regions 31, 32, 33, 34, 35 of the original patterned are enlarged outwards with a line width of A to form enlarged regions 31a, 32a, 33a, 34a, and 35a. Parts of the regions are merged or overlapped with each other, for example, the regions 31a and 32a, and the regions 32a and 33a are merged or overlapped.

Figure 2C:
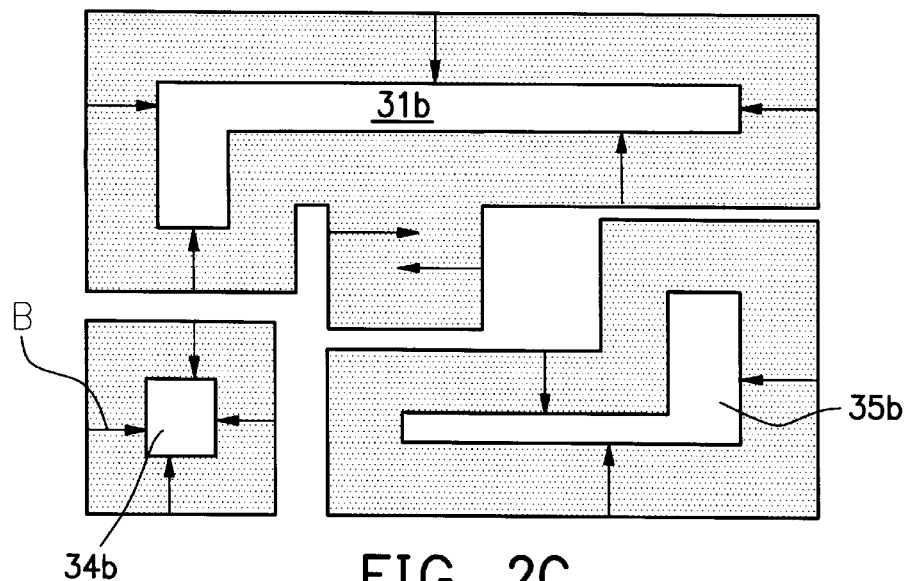

In FIG. 2C, the margins of the enlarged regions 31a, 32a, 33a, 34a, and 35a are diminished inwards until small regions, such as region 33a disappears. Meanwhile, region 31a and region 32a in FIG. 2B have been merged as one region 31b in the last enlarging step. The region 34a and the region 35a in FIG. 2B are diminished as region 34b and 35b. The line width to be diminished is denoted as B. The diminished active regions are enlarged again, and the the active regions are smaller tha the active regions in the original pattern.

Figure 2D:
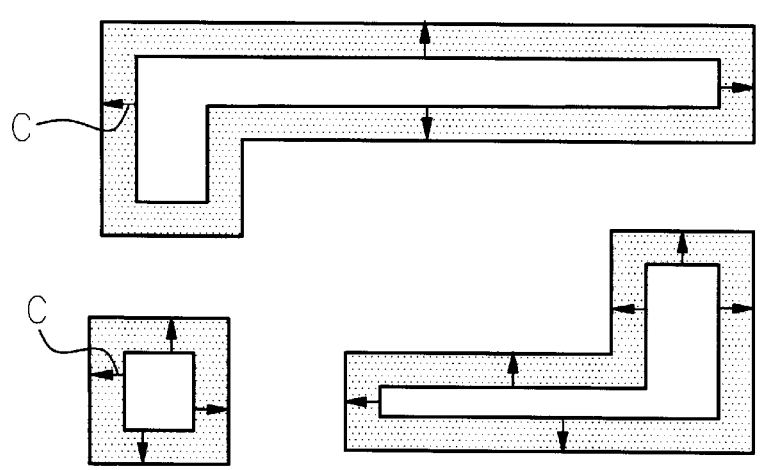

In FIG. 2D, using a reverse treatment, a reverse pattern of the pattern shown in FIG. 2C is obtained. The reverse pattern is then enlarged with a line width of C.

Figure 2E:
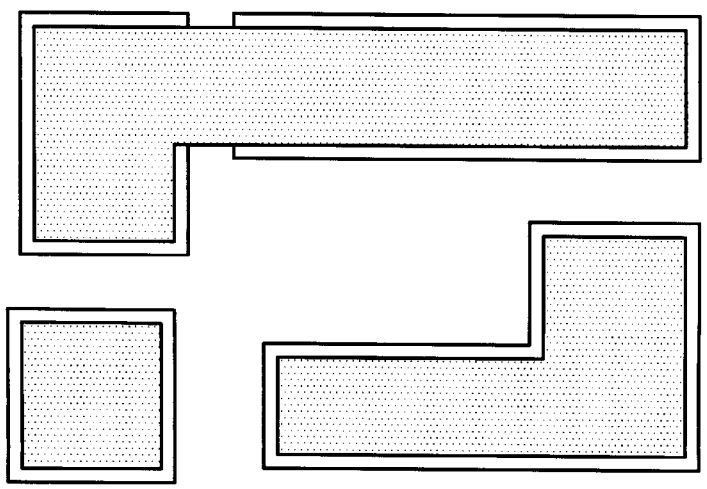

In FIG. 2E, by combining the reverse pattern in FIG. 2D and the original pattern shown in FIG. 2A, the smaller regions 33 (as shown in FIG. 2A) in the original patterned are thus eliminated.

The combined pattern shown in FIG. 2E is defined as a pattern. Using the pattern for exposure, the substrate is patterned to define a plurality of trench regions on the substrate. An insulation layer is formed on the substrate to fill the trench regions, and then the insulation is polished. A shallow trench isolation is then formed by performing chemical mechanical polishing.

In FIG. 2B, since the trenches with a small area are merged with other regions, while filling the insulation layer on a substrate, continuous jogs are formed to open the reverse mask to be etched. The continuous jogs formed after reverse mask process is thus prevented.

In FIG. 2C and FIG. 2D, by sizing down and sizing up the patterns, the active regions with smaller regions are eliminated. The reverse region with a small region is thus avoided. Therefore, the misalignment and difficulty of etching are improved.

The invention thus provides a method of forming a reverse mask to solve the problems of misalignment during exposure caused by the small trench and active region. The method is thus advantageous to fabrication process under a line width of 0.25 $\mu$m. In accordance with the invention, the method of trench polishing, comprises providing a semiconductor substrate, providing a photo-mask, patterning the substrate with the photo-mask with the combined pattern for defining a plurality trench regions on the substrate, forming an insulation layer on the substrate, and polishing the insulation layer. The step of providing a photo-mask further comprising providing an original pattern which comprises a plurality of active regions with individual size, enlarging the original pattern outwards to connect and merge some of the active regions, diminishing the active regions inwards until some small active regions eliminate, the diminished line width being donated as B, performing a reverse treatment to obtain a reverse pattern, enlarging the reverse pattern with a line width C, and combining the enlarged reverse pattern and the original pattern.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of trench polishing, comprising:

providing a semiconductor substrate;

providing a photo-mask, a method of forming the photo-mask further comprising:

providing an original pattern which comprises a plurality of active regions with individual size;

enlarging the original pattern outwards to connect and merge some of the enlarged active regions;

diminishing the enlarged active regions inwards until some small active regions are eliminated;

performing a reverse treatment on the diminished active regions to obtain a reverse pattern;

enlarging the reverse pattern with a line width C; and combining the enlarged reverse pattern and the original pattern;

patterning the substrate with the photo-mask with the combined pattern for defining a plurality trench regions on the substrate;

forming an insulation layer on the substrate; and polishing the insulation layer.

2. A method for diminishing small active regions among a plurality of active regions of a pattern, comprising:

enlarging the active regions of an original pattern;

diminishing the enlarged active regions until the smaller active regions disappear;

enlarging the diminished active regions again, the enlarged active regions being smaller than the active regions in the original pattern; and performing a reverse treatment on the enlarged active regions to obtain a reverse pattern.

3. A method of forming a photo-mask, comprising:

providing an original pattern which comprises a plurality of active regions;

enlarging the active regions outwards, parts of the enlarged active regions merging with each other;

diminishing the enlarged active regions inwards with a line width B until the smaller active regions are eliminated;

performing a reverse treatment on the diminished active regions to obtain a reverse pattern;

enlarging the reverse pattern with a line width C; and combining the enlarged reverse pattern and the original pattern as a pattern for subsequent exposure process.

* * * * *